United States Patent [19]
Severson et al.

[11] Patent Number: 5,474,120
[45] Date of Patent: Dec. 12, 1995

[54] TWO-CHANNEL COOLING FOR PROVIDING BACK-UP COOLING CAPABILITY

[75] Inventors: Mark H. Severson; Ian Tinkler, both of Rockford, Ill.

[73] Assignee: Sundstrand Corporation, Rockford, Ill.

[21] Appl. No.: 776,545

[22] Filed: Oct. 15, 1991

[51] Int. Cl.⁶ .................................................. B60H 3/06
[52] U.S. Cl. ............................. 165/39; 165/34; 361/691; 361/695; 361/678; 454/76; 454/71; 62/259.2; 236/49.3
[58] Field of Search ............................. 165/124, 39, 34; 236/49.3, 1 E, 1 EA; 62/181, 259.2; 361/384, 691, 695, 678; 454/71, 76

[56] References Cited

U.S. PATENT DOCUMENTS

| | | | |
|---|---|---|---|
| 2,953,078 | 9/1960 | Best | 98/1.5 |
| 3,390,538 | 7/1968 | Miller | 236/1 EA |
| 3,533,466 | 10/1970 | Salamon | 165/39 |
| 4,085,594 | 4/1978 | Mayer | 236/1 EA |
| 4,120,173 | 10/1978 | Kimpel | 62/181 |
| 4,126,269 | 11/1978 | Bruges | 236/49.3 |
| 4,463,897 | 8/1984 | Denneny, Jr. et al. | 236/92 R |
| 4,485,624 | 12/1984 | Melchior | 165/39 |
| 4,648,007 | 3/1987 | Garner | 361/384 |
| 4,756,473 | 7/1988 | Takemae et al. | 236/49.3 |
| 4,767,262 | 8/1988 | Simon | 361/384 |
| 5,054,545 | 10/1991 | Ghaemian | 361/384 |
| 5,253,484 | 10/1993 | Corman et al. | 62/259.2 |

FOREIGN PATENT DOCUMENTS

| | | | |
|---|---|---|---|
| 0031787 | 2/1982 | Japan | 165/39 |
| 0031789 | 2/1982 | Japan | 165/39 |
| 0255299 | 11/1986 | Japan | 165/39 |
| 0025599 | 1/1989 | Japan | 361/384 |
| 0254797 | 10/1990 | Japan | 361/384 |

*Primary Examiner*—John K. Ford
*Attorney, Agent, or Firm*—Sundstrand Corporation

[57] ABSTRACT

A cooling system is provided for compartments containing a heat generating apparatus, such as solid state variable speed constant frequency system, whose functionality is essential and whose cooling needs vary significantly during use. A main coolant channel is used to provide cooling to the heat generating apparatus under normal operating conditions. During an overtemperature condition; an auxiliary coolant channel provides additional coolant to the heat generating apparatus. Both of the channels are partially disposed within the heat generating apparatus, and they are both completely separate and free of fluid communication with each other. Each channel also contains a pump, such as a fan, for applying a motive force necessary to deliver the coolant to the heat generating apparatus. The pump contained in the main coolant channel is operated constantly, while the pump contained in the auxiliary coolant channel is selectively introduced by a cooling system controller which is responsive to the temperature conditions of the heat generating apparatus.

10 Claims, 6 Drawing Sheets

TWO-CHANNEL COOLING FOR PROVIDING BACK-UP COOLING CAPABILITY

TECHNICAL FIELD

This invention relates to cooling systems particularly for aircraft compartments containing an essential apparatus which generates a variable amount of heat during use.

BACKGROUND OF THE INVENTION

Modern aircraft need to convert the variable frequency power provided by engine rotation into constant frequency electrical power. One method of doing this is through the use of a solid state variable speed constant frequency (VSCF) system in conjunction with a generator. Because this equipment generates heat during use, adequate cooling must be provided to prevent an overtemperature condition from developing. Prolonged durations at high temperatures could impact the reliability or destroy the electronic equipment. An overtemperature condition could occur because of a sudden increase in power dissipated by the electronic equipment. Alternatively, an overtemperature condition could also occur when there is no increase in power dissipation but there is loss of cooling.

Thus, there are two problems which cooling system designers currently face. The first is how to prevent equipment from experiencing prolonged durations at high temperatures in the event of a sudden increase in power dissipation by that equipment. There are many situations which can cause this sudden increase to occur. For example, such a conversion system will normally operate at only one-half to two-thirds capacity. At times, it may be necessary to run the system at full capacity which will result in a significant increase in total heat generated by the system. In a second example, such a conversion system may serve only as a back-up and will therefore only require cooling during emergency situations. The cooling system must be designed so that worst case needs may be met, otherwise the conversion system will sustain damage. It is wasteful, however, to provide at all times cooling sufficient for worst case conditions. An aircraft engine must supply bleed air to the cooling system; therefore, requiring the engine to supply more air than is necessary having a negative impact on engine operating efficiency.

The second problem is how to provide redundant cooling to essential systems which will be destroyed almost immediately in the event of no cooling. Loss of electrical power, for example, would prove catastrophic for an airplane with electrical controls. Primary cooling systems may fail for any number of reasons, such as lost coolant pressure or blocked cooling channels.

Best, in U.S. Pat. No. 2,953,078, recognizes the need to provide adequate cooling to various compartments of an aircraft. The Best invention relates to an improved system for distribution of air to the cabin and various compartments of an aircraft which require air conditioning. The Best invention contemplates the use of ram air to supplement and/or replace an engine compressor supply for cooling the external compartments in an integrated distribution system. The cold air supply is distributed by a network of conduit and valves. The Best invention, however, neither provides redundant cooling for essential hardware nor does it accommodate hardware whose peak cooling needs substantially exceed their nominal cooling needs.

With reference to FIG. 1 one prior art improvement on the Best concept utilizes an auxiliary coolant channel or conduit 24" which is linked to a main channel 14 before it reaches the heat generating apparatus 44. In this scheme, a temperature sensor (not illustrated) monitors the temperature of the apparatus. A controller responsive to this sensor activates an auxiliary fan 28 in the auxiliary channel in the event of an overtemperature condition of the apparatus. The auxiliary fan 28 creates a pressure in the auxiliary channel greater than that in the main channel, causing check valves 18 and 32 responsive to air pressure to switch the coolant source coupled to the electronics 44 from the main channel to the auxiliary channel. In doing this, the check valves 18 and 32 prevent the air mass flow in the auxiliary channel 24 from reaching paths which need no additional cooling. This is an improvement over the Best invention in that the cooling system is responsive to an overtemperature condition, whether it be caused by main cooling system failure or by increased thermal energy production. However, for maximum efficiency, the apparatus should receive all of the coolant from the auxiliary channel in addition to a predetermined share of coolant from the main channel. This scheme allows for only one channel to be used at a time, because it does not provide for an auxiliary channel that is separate and free of fluid communication with the main channel. Therefore, this scheme results in an auxiliary cooling system which is larger than necessary.

The operation of the prior art of FIG. 1 is described as follows. During normal operation, heat generating apparatus 44 receives a predetermined share of the coolant supplied by a main coolant channel 14 and it receives no coolant from an auxiliary conduit 30. During an overtemperature condition; cooling controller 40, which is responsive to the temperature of heat generating apparatus 44, commands auxiliary fan 28 to turn on. This creates an air pressure in conduit 30 which is greater than that in conduit 24 and conduit 22, forcing check valve 32 open and check valve 18 closed. This effectively switches the source of coolant for apparatus 44 from main conduit 14 to auxiliary conduit 30. Check valve 18 prevents coolant in auxiliary conduit 30 from flowing into main conduit 16 and prevents coolant in main conduit 16 from reaching apparatus 44. This design does not provide the heat generating apparatus 44 with two separate channels free of fluid communication or mixing, thereby preventing the heat generating apparatus from receiving its predetermined share of coolant from the main channel 14. This coolant will therefore be wasted, since compartments (not shown) which are connected to conduit 16 need no additional coolant. If this coolant could reach apparatus 44, then an auxiliary cooling system could be designed smaller. The present invention accomplishes this by providing separate channels, free of fluid communication or mixing, from the coolant source to the heat generating apparatus for the constant and temporary sources.

SUMMARY OF THE INVENTION

A primary object of the subject invention is to provide additional cooling to hardware whose peak cooling needs substantially exceed their nominal cooling needs, wherein said cooling is provided by both a main coolant channel and a separate auxiliary coolant channel.

Another object of the subject invention is to provide redundant cooling to essential hardware.

In the attainment of the foregoing objects, the apparatus that encompasses the preferred embodiment of the invention is a cooling system comprising a constant source of coolant suitable for cooling a heat generating apparatus under normal operating conditions, and a controller for selectively introducing a separate temporary source during an overtemperature condition. The temporary source is free of mixed or recirculated coolant from the constant source. Both the constant source and the temporary source are coupled to a means for pumping the coolant, such as a fan.

The subject invention is similar to prior art described with reference to FIG. 1 only in that it involves a cooling system which is responsive to an increase in temperature. Unlike the prior art of FIG. 1, the subject invention functions such that the main coolant channel and the auxiliary coolant channel are used in a supplementary manner. This is made possible by the fact that the main and auxiliary channel are to be separate and free of fluid communication with each other. Accordingly, the subject invention represents an evolutionary step over prior art in that it utilizes the combined cooling effect of a main channel and an auxiliary channel, the channels being separate and free of fluid communication with each other.

In one particular embodiment, an intermediate channel may be used to couple the temporary source to the heat generating apparatus. This intermediate channel is also coupled to the constant source of coolant, and contains a valve for exclusively selecting between the constant source and the temporary source.

During normal operation, coolant will be supplied to the heat generating apparatus by the constant source. When the constant source is not capable of supplying coolant at a rate sufficient to properly cool the apparatus, additional coolant is supplied by the temporary source. Finally, when the constant source can supply little or no coolant, the temporary source supplies all of the necessary coolant to the apparatus.

Other objects and advantages of the subject invention will be apparent upon reference to the accompanying description when taken in conjunction with the following drawings.

DETAILED DESCRIPTION OF THE PREFERRED EMBODIMENT

The present invention may be used in conjunction with many different coolant distribution systems. An example of such a system is contained in Best U.S. Pat. No. 2,953,078. This system, and those described hereafter, use air as a coolant and a fan as a means for pumping. Any such system must contain at minimum means for providing coolant to a heat generating apparatus, hereafter also referred to as the electronics apparatus or more simply the apparatus, and means for discharging the coolant once it has passed through the apparatus.

Figure 1:
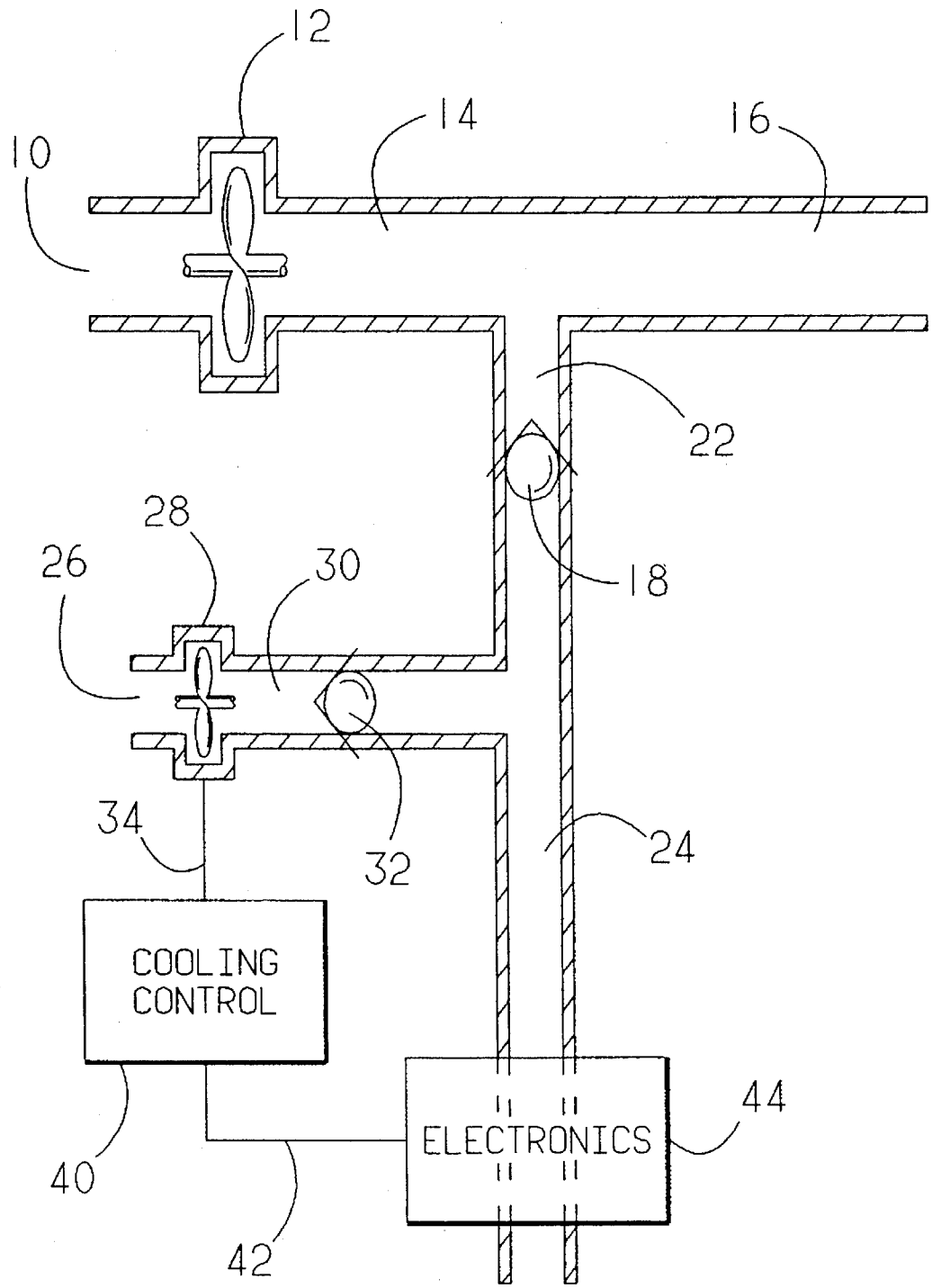
FIG. 1 is a schematic representation of prior art.
Figure 2:
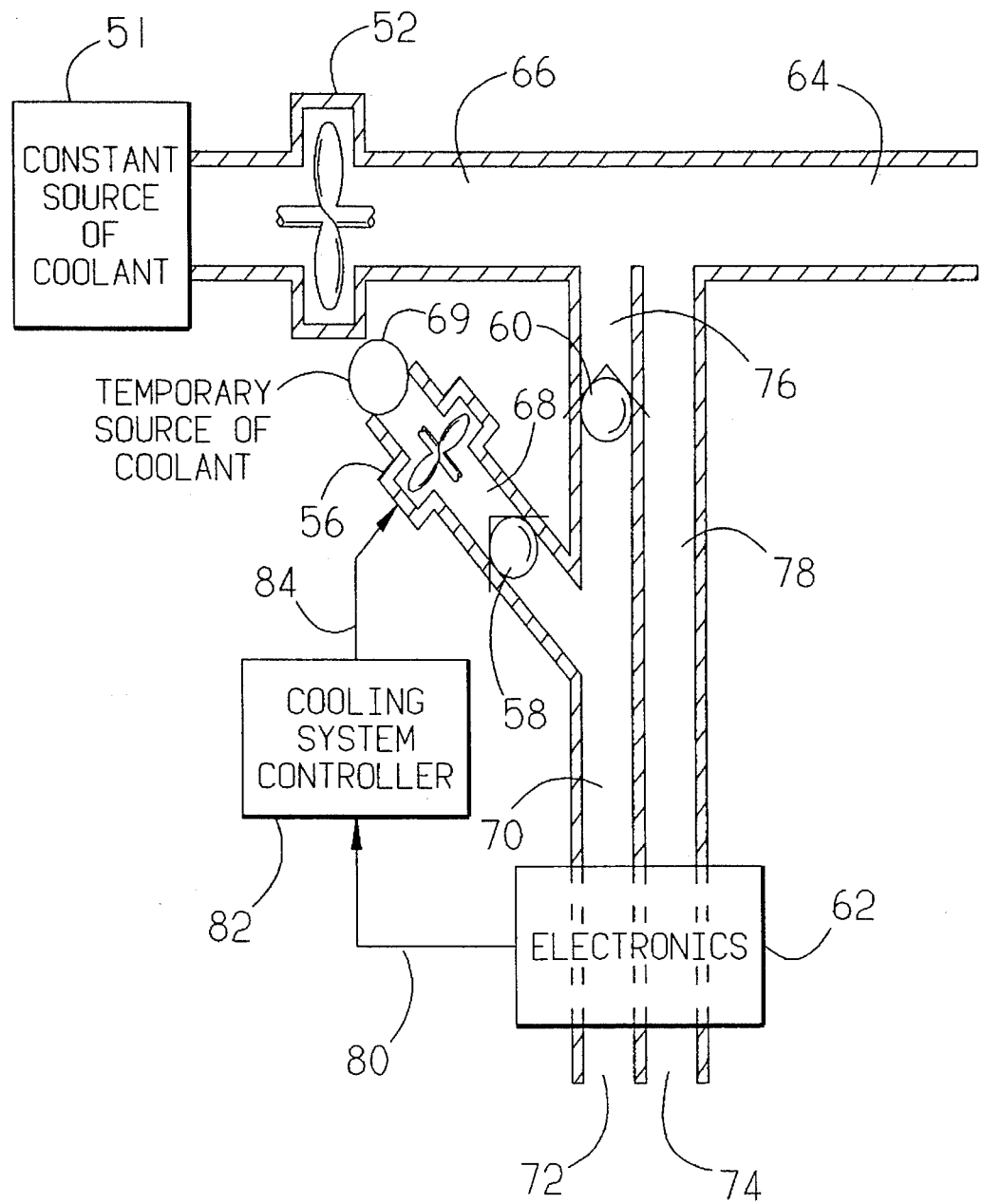
FIG. 2 is a schematic representation of a first preferred embodiment of the invention.

Construction of a preferred embodiment of the present invention is shown in FIG. 2. Like reference numerals identify like parts in FIGS. 2–6. An entrance 50 to conduit 66 is connected to a supply of cool air 51 which may be a constant source of coolant. A fan 52 is placed within conduit 66 to achieve air mass flow. Conduit 66 branches into conduits 64, 76 and 78. Conduit 64 couples conduit 66 to other compartments which are in need of cooling. Conduit 78 couples conduit 66 to apparatus 62 and is at least partially disposed within apparatus 62. Apparatus 62 is further coupled to a means for discharging air 74. Conduit 76 connects conduit 66 to intermediate conduit 70. Conduit 70 is considered to be an intermediate channel, and its use is optional. Check valve 60 couples conduit 76 to conduit 70, and provides the ability to prevent air mass flow through conduit 76. Conduit 70 is also coupled to conduit 68, via check valve 58. An entrance 54 to conduit 68 is connected to a means for providing cool air 69 which may be a temporary source. Air mass flow can be established by auxiliary fan 56 which is also contained within conduit 68. Conduit 70 is at least partially disposed within apparatus 62, which is coupled to a means for discharging air 72.

Cooling system controller 82 establishes a temperature feedback control loop. Controller 82 is connected to electronics apparatus 62 via input line 80, and to auxiliary fan 56 via output line 84. While those of ordinary skill will recognize that there are many ways to specifically implement controller 82, the design of this device is immaterial to the present invention.

Figure 3:
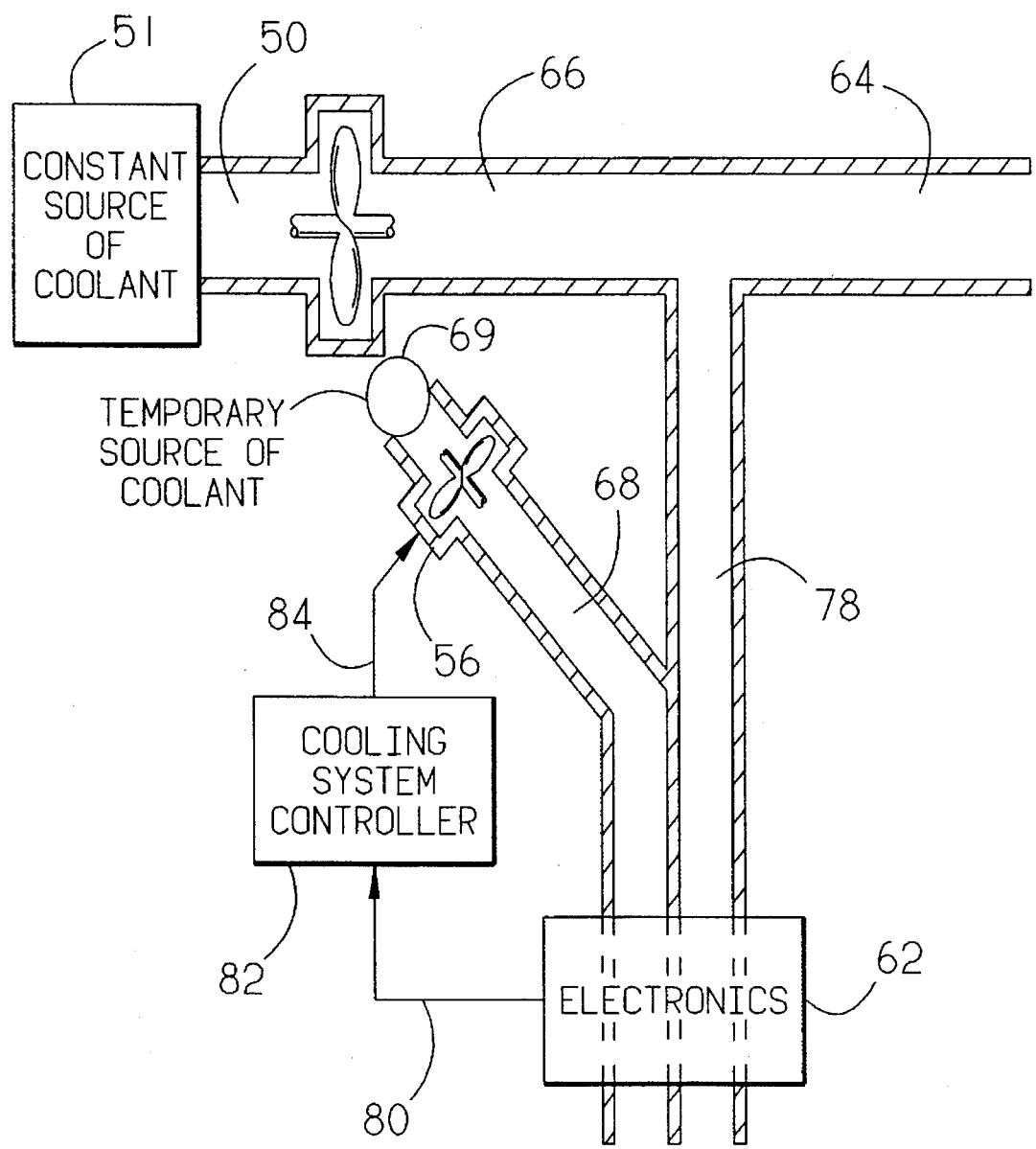
FIG. 3 is a schematic representation of an second embodiment of the invention.

An alternative implementation of the invention, shown in FIG. 3, omits the use of the intermediate channel, comprised of conduit 76 and coupled to check valves 58 and 60. This implementation is simpler, but suffers from reduced flexibility.

Figure 4:
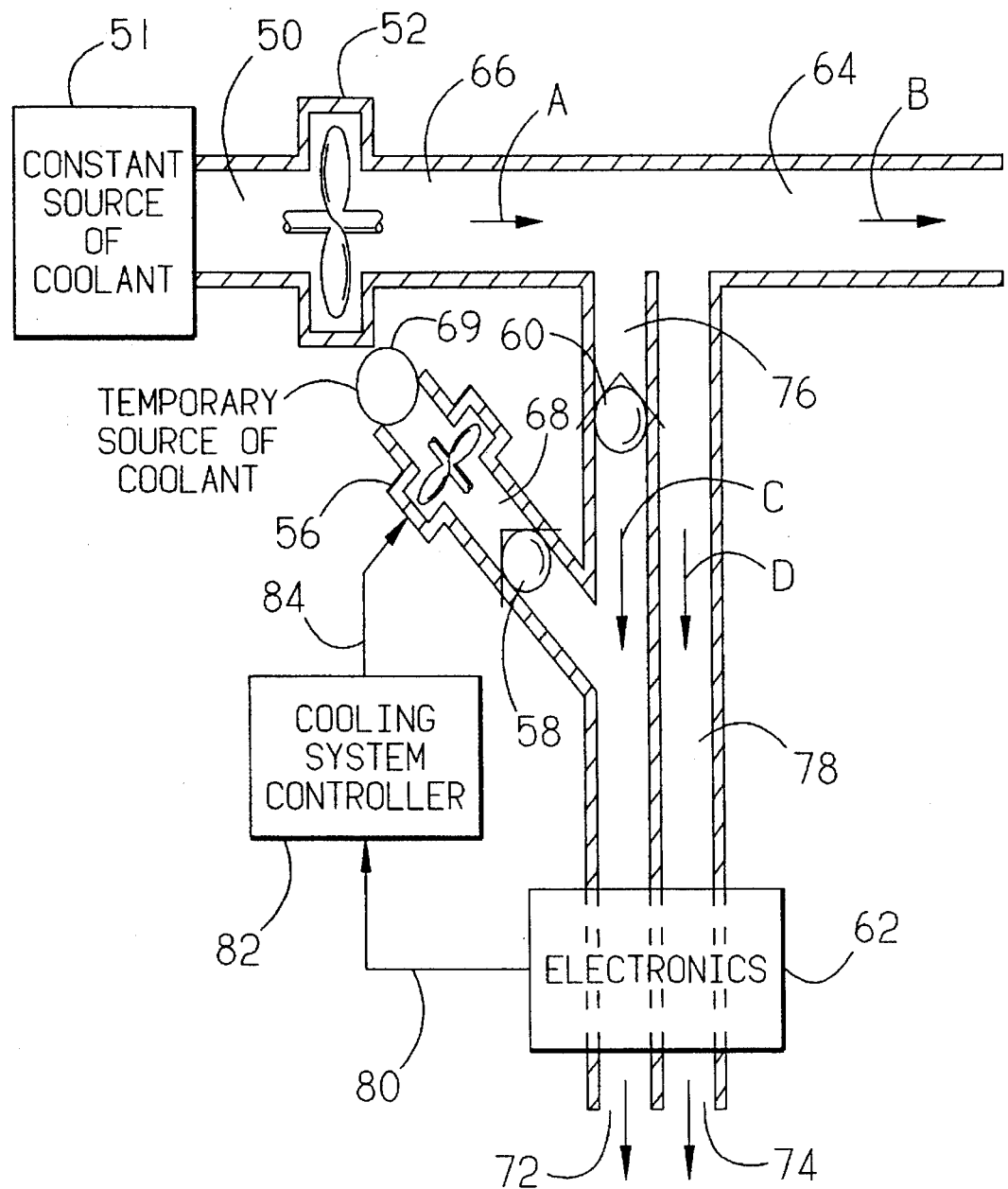
FIG. 4 depicts operation of the embodiment of FIG. 2 during normal operating conditions.
Figure 5:
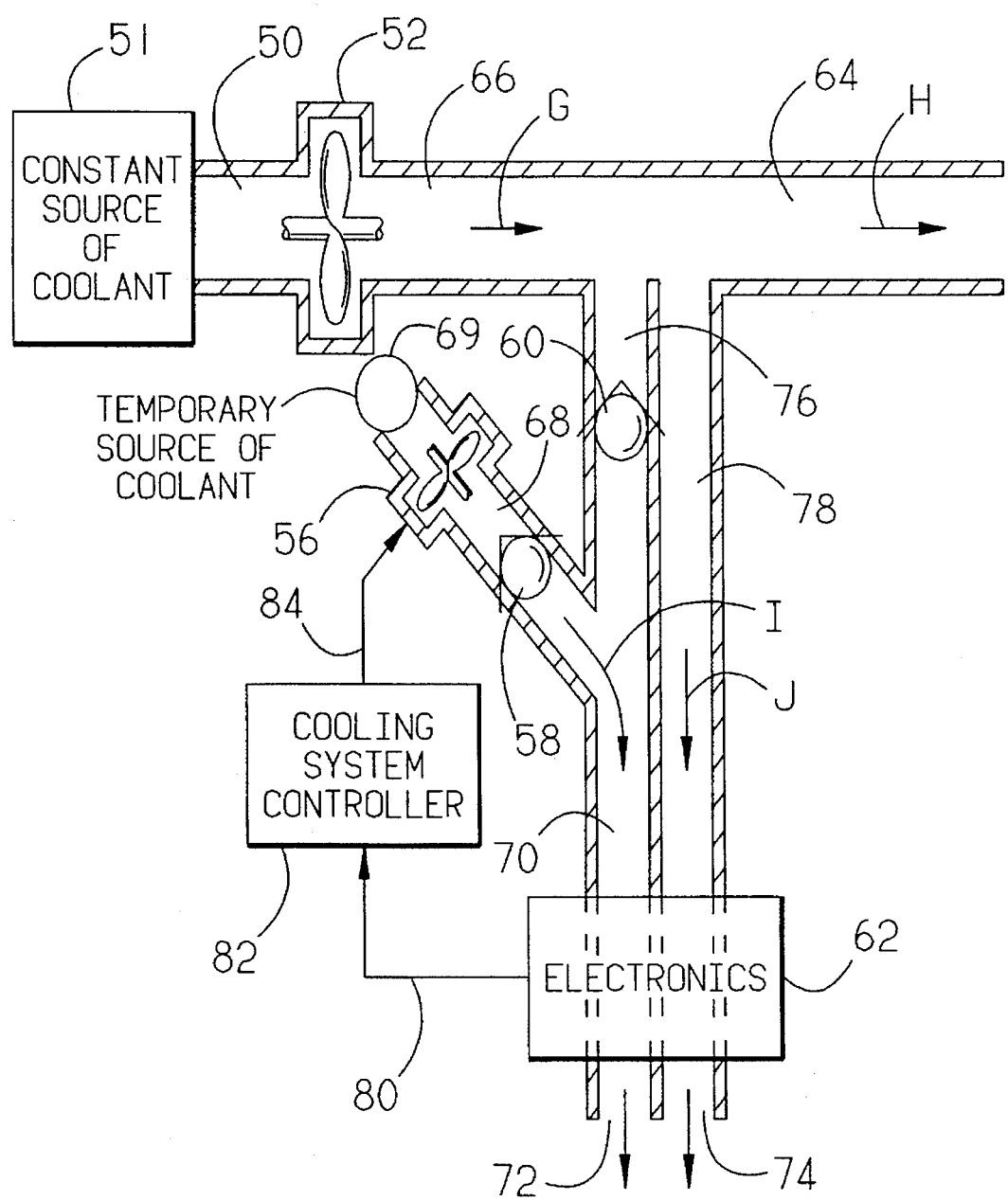
FIG. 5 depicts operation of the embodiment of FIG. 2 during periods of peak heat production.
Figure 6:
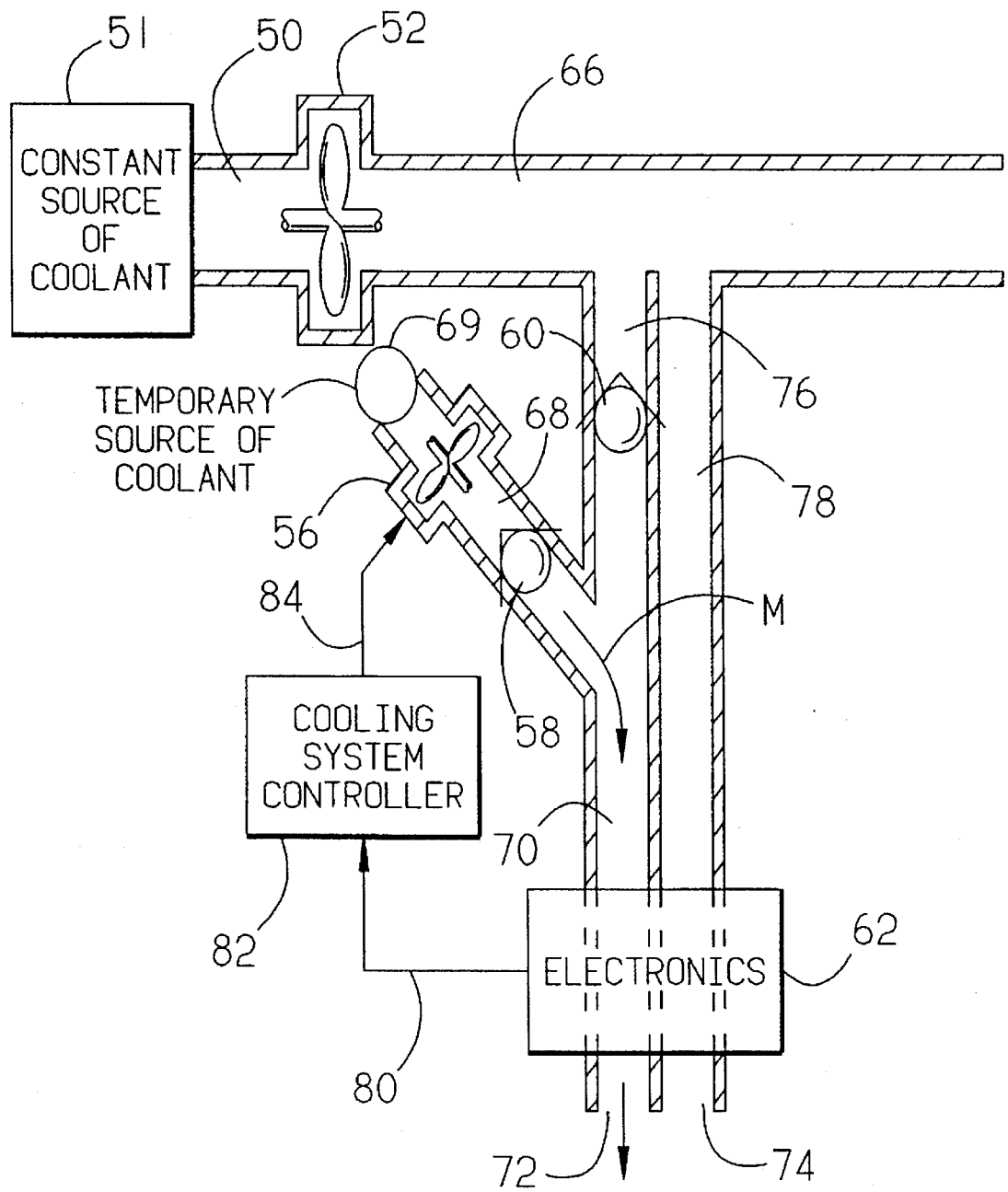
FIG. 6 depicts operation of the embodiment of FIG. 2 during main cooling system failure.

The invention has three modes of operation which are shown in FIGS. 4, 5 and 6. An arrow identifies a flow path of fluid. The check valves 58 and 60 are illustrated in their closed condition, although it should be understood that fluid flow indicated by an arrow represents that the check valve through the fluid flow must pass is, in fact, open. FIG. 4 shows the invention during normal operation. Fan 52 produces an air mass flow (represented as arrow A) through conduit 66. Part of this air mass flow (represented as arrow B) continues down conduit 64, while the rest (represented as arrows C and D) continues down conduits 76 and 78, respectively. Conduits 76 and 78, along with air mass flows C and D, extend into an electronics apparatus 62, where the heat exchange occurs. The air mass flows C and D then pass to a means for discharging air. During normal operation, air mass flow C creates an air pressure which forces check valve 58 to be closed, preventing air mass flow in conduit 68. This air pressure also forces the check valve in conduit 76 to be open, causing a lack of air flow obstruction which is represented by not illustrating the check valve.

FIG. 5 illustrates the operation of the invention while an electronics apparatus 62 needs maximum cooling. As during normal operation, an air mass flow J comes from air mass flow G which was established by a fan 52. Unlike normal operation, controller 82 commands auxiliary fan 56 to establish air mass flow I, which forces the check valve 58 in conduit 62 to be open and check valve 60 to be closed. Air mass flow I delivers a much larger mass of cool air to electronics apparatus 62 than does air mass flow J, causing greater cooling to be achieved.

FIG. 6 illustrates the operation of the invention while it is in a redundant cooling mode. A main cooling system has been rendered inoperable and is incapable of providing coolant to electronics apparatus 62; therefore an auxiliary source is needed. As in the "maximum cooling" mode, controller 82 commands auxiliary fan 62 to establish air mass flow M, which forces the check valve 58 in conduit 68 to be open. Air mass flow M will then cool apparatus 62, thus allowing it to remain functional until repairs can be made.

From the foregoing description, it is apparent that the invention described provides a novel cooling system comprising a main coolant channel and an auxiliary coolant channel. The auxiliary coolant channel may supplement the main channel during periods of peak heat production or it may provide a backup to the main channel in case of failure.

Those skilled in the art will recognize that alternative embodiments exist which are in essence the same as those described herein. For example, other gases (freon, etc.) or liquids (water, oil, etc.) may replace air as the coolant is used. In the case of liquid coolants, it will be obvious that liquid pumps would replace fans in uses described herein.

Although this invention has been illustrated and described in connection with the particular embodiments illustrated, it will be apparent to those skilled in the art that various changes may be made therein without departing from the spirit of the invention as set forth in the appended claims.

We claim:

1. A cooling system for a heat generating apparatus comprising:

a main coolant channel coupled to a destination requiring cooling by a coolant fluid and to the heat generating apparatus for transporting the coolant fluid to the destination and to the heat generating apparatus from the main coolant channel;

a first unobstructed coolant channel coupled to the main coolant channel and to the heat generating apparatus for transporting the coolant fluid from the main coolant channel to the heat generating apparatus continually while the coolant fluid is flowing in the main coolant channel;

a second coolant channel coupled to the heat generating apparatus for transporting additional coolant fluid from the second coolant channel to the heat generating apparatus which is supplemental to the coolant fluid flowing to the heat generating apparatus from the first coolant channel;

a third coolant channel coupled to the main coolant channel and to the second coolant channel for transporting the coolant fluid from the main coolant channel to the second coolant channel;

a first check valve disposed in the second coolant channel for permitting the additional coolant fluid to flow through the second coolant channel to the heat generating apparatus and blocking the coolant flow within the third coolant channel through the first check valve;

a second check valve disposed in the third coolant channel for permitting the coolant fluid to flow through the third coolant channel to the second coolant channel and blocking the coolant flow from the second coolant channel through the second check valve; and a controller, responsive to a temperature of the heat generating apparatus, for controlling the flow of the additional coolant fluid through the second coolant channel to the heat generating apparatus in response to the temperature of the heat generating apparatus.

2. A cooling system in accordance with claim 1 further comprising:

a first pump disposed within the main coolant channel for pumping the coolant fluid through the main coolant channel; and a second pump disposed within the second coolant channel and coupled to the controller for pumping the additional coolant fluid through the second coolant channel in response to control by the controller.

3. A cooling system in accordance with claim 2 wherein:

the first and second pumps are fans and the fluid is air.

4. A cooling system in accordance with claim 1 wherein:

the heat generating apparatus comprises electronic equipment.

5. A cooling system in accordance with claim 4 wherein:

the electronic equipment comprises a variable speed constant frequency power conversion system.

6. A cooling system in accordance with claim 2 wherein:

the heat generating apparatus comprises electronic equipment.

7. A cooling system in accordance with claim 6 wherein:

the electronic equipment comprises a variable speed constant frequency power conversion system.

8. A cooling system in accordance with claim 3 wherein:

the heat generating apparatus comprises electronic equipment.

9. A cooling system in accordance with claim 8 wherein:

the electronic equipment comprises a variable speed constant frequency power conversion system.

10. A cooling system in accordance with claim 1 further comprising:

a constant source of the coolant fluid coupled to the main coolant channel for supplying the coolant fluid to the heat generating apparatus during a normal operating condition of the heat generating apparatus; and a temporary source of coolant fluid coupled to the second coolant channel which is free from fluid communication with the constant source and free of recirculated coolant fluid from the constant source for supplying the additional coolant fluid to the heat generating apparatus in response to a temporary overtemperature condition of the heat generating apparatus.

* * * * *